April 22, 1969 J. E. GOELL 3,440,567
HIGH-SPEED FREQUENCY MODULATION DEVIATOR
Filed Sept. 28, 1966
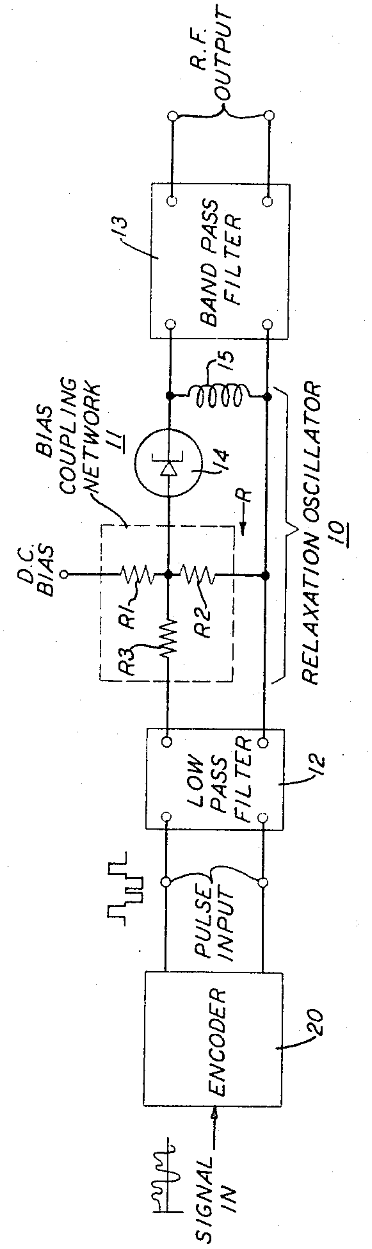
INVENTOR
J. E. GOELL
BY
Sylvan Sherman
ATTORNEY United States Patent Office 3,440,567
Patented Apr. 22, 1969

3,440,567
HIGH-SPEED FREQUENCY MODULATION DEVIATOR

James E. Goell, Middletown, N.J., assignor to Bell Telephone Laboratories, Incorporated, Murray Hill, N.J., a corporation of New York Filed Sept. 28, 1966, Ser. No. 582,733
Int. Cl. H03c 3/06
U.S. Cl. 332—16 4 Claims This invention relates to ultra-high-speed frequency modulation (FM) deviators.

In the copending application by W. D. Warters, Ser. No. 568,893, filed July 29, 1966, and assigned to applicant's assignee, there is described a differential phase modulated (DPM), pulse code modulation communications system in which frequency modulation techniques are utilized to produce the differential phase modulated signals (FM–DPM). In such a system, the information, at baseband, is pulse-encoded, and the pulses thus derived are used to deviate the frequency of a signal oscillator above and below its normal, unmodulated frequency.

In a typical PCM system, the pulse repetition rate (bit rate) of the pulse train is generally much less than the oscillator frequency. As an example, the ratio of the oscillator frequency to bit rate might be of the order of 70 to 1. Thus, in such a system there are 70 cycles of oscillator signal within each pulse interval. In an FM–DPM system, having a frequency ratio of this magnitude, it is relatively easy for the oscillator frequency to change in accordance with the encoded signal, as it is no problem for an oscillator to change its frequency within several cycles. However, the problem completely changes its character when the ratio of oscillator frequency to bit rate is reduced to less than 10 to 1, as it is in the ultra-high-speed ($306\times10^6$ bits/sec.). FM–DPM system currently under experimental investigation for use in the Bell System which operates at a ratio of 4.25 to 1. It is quite apparent that with only 4.25 oscillator cycles per pulse interval, the oscillator must be capable of changing its frequency within a much shorter period.

In accordance with the present invention, ultra-high-speed frequency deviation is obtained by using a voltage-controlled relaxation oscillator as an FM deviator. Because a relaxation oscillator can be tuned by varying the bias supplied to it through nonreactive elements, and because the energy in its reactive element is supplied within one cycle, its frequency can be changed much more rapidly than that of an L-C tuned sinusoidal oscillator.

Since the bit rate and the oscillator frequency are so close, means are advantageously provided to keep the oscillator signal out of the pulse encoding circuit, and to keep the modulating pulses out of the output signal circuit. In accordance with an illustrative embodiment of the invention, a low-pass filter is used to isolate the encoding circuit from the oscillator, while the output from the relaxation oscillator is taken across the oscillator inductor as one means of keeping the modulation pulses out of the output signal circuit. The oscillator output is converted to a sinusoidal signal by means of a bandpass filter tuned to the oscillator's fundamental frequency.

In the drawing there is shown an FM deviator in accordance with the invention, comprising a relaxation oscillator 10, including a resistive bias-coupling network 11, a low-pass filter 12 at the input end of the deviator, and a bandpass filter 13 at the output end of the deviator.

Oscillator 10 is a single diode relaxation oscillator of the type described on pages 204–207 of the book by S. P. Gentile, entitled "Basic Theory and Applications of Tunnel Diodes," and comprises, in series, a tunnel diode 14, an inductor 15, and an equivalent resistance R. The equivalent resistance R is the output resistance of the bias-coupling network 11.

A D.C. bias is supplied by a D.C. bias source (not shown) through the voltage divider formed by resistors $R_1$ and $R_2$ of network 11. A variable bias, in the form of signal pulses derived from a signal encoder 20, is supplied to the oscillator through the voltage divider formed by resistors $R_3$ and $R_2$.

The modulating signal pulses are coupled from encoder 20 to oscillator 10 through low-pass filter 12. The output from oscillator 10 is taken from across inductor 15, and is passed through bandpass filter 13.

In operation, the circuit parameters R and L, and the diode bias are selected to produce the desired oscillator frequency $f_1$. (For details relating to the design of single diode relaxation oscillators, see the above-cited book and also see the "Tunnel Diode Manual," published by the General Electric Company.) For the ultra-high-speed system contemplated by the invention the circuit parameters for one embodiment of the invention are as follows:

| | Ohms |
|---|---|
| $R_1$ | 250 |
| $R_2$ | 15 |
| $R_3$ | 33 |

L is a ½-inch length of 0.010-inch diameter wire.

The diode is a point contact diode made of p-type germanium having a resistivity of 0.00055 ohm-cm. The point is pulse-formed using a eutectic lead antimony whisker. The diode parameters are:

| | | |
|---|---|---|
| $i_p$ | ma | 5.2 |
| $v_p$ | mv | 0.080 |
| $i_v$ | ma | 0.8 |
| $v_v$ | mv | .300 |

and junction capacitance $\approx$0.5 pf., where $i_p$, $i_v$, $v_p$ and $v_v$ refer to the peak and valley currents and voltages bounding the negative resistance portion of the diode current-voltage characteristic.

The bias supply voltage is adjusted to a value between $v_p$ and $v_v$ to give the desired oscillator frequency. With a pulse bit rate of 306 mb./s., a frequency of 1300 mc./sec., gives the desired 4.25 cycles per pulse interval.

As the oscillator voltage across the inductor 15 is not sinusoidal, the oscillator output is advantageously passed through bandpass filter 13 which is tuned to pass only the fundamental frequency component of the oscillator output. Accordingly, in the specific illustrative embodiment described herein, filter 13 is tuned to 1300 mc./sec., and has a bandwidth of 390 mc./sec. to accommodate the frequency components associated with the frequency modulated signal produced when input pulses are supplied to the oscillator.

Because the pulse bit rate and the oscillator frequency are relatively close, means are advantageously provided to prevent the oscillator signal from getting back into the signal encoder circuit and for preventing the modulating pulses from entering the output circuit. The former is accomplished by the inclusion at the input to oscillator 10 of low-pass filter 12, adjusted to cut off below the oscillator frequency. The latter is accomplished by taking the oscillator output across inductor 15, which is a relatively low impedance at the pulse rate, and then filtering the output in the bandpass filter 13.

The FM-deviator described hereinabove, when operated with modulating pulses of the order of $\pm25$ mv., caused the oscillator frequency to deviate between 4.25 and 4.00 cycles, and between 4.25 and 4.50 cycles within a pulse interval, depending upon pulse polarity. This is equivalent to a phase deviation of $-90$ degrees and $+90$ degrees, which represents a 180 degree differential phase shift.

While the invention has been described using a tunnel diode more generally any device having a negative resistance region and capable of oscillating at the frequency of interest can be used to practice the invention.

What is claimed is:

1. In a frequency modulated pulse code modulation system;

a signal encoder for encoding information into a sequence of pulses;

a frequency modulation deviator comprising a voltage-controlled relaxation oscillator;

means for coupling said encoder to said oscillator to vary the frequency thereof in accordance with said sequence of pulses; and means including a bandpass filter tuned to said oscillator frequency for coupling out of said deviator.

2. The system according to claim 1 wherein the ratio of said oscillator frequency to the pulse repetition rate of said sequence of pulses is less than 10 to 1.

3. The system according to claim 1 wherein said means for coupling said encoder to said oscillator includes a low-pass filter having a cut-off frequency below said oscillator frequency.

4. In combination;

a tunnel diode relaxation oscillator operative at a frequency $f_1$ comprising in series;

a tunnel diode an inductor and a resistive input network;

a direct-current source coupled through said network for biasing said diode;

means including a low-pass filter for coupling signal pulses to said oscillator through said network;

said pulses having a repetition rate $f_2$ such that $f_1$ is less than $10f_2$; and output means including a bandpass filter tuned to $f_1$, connected across said inductor for coupling out of said oscillator.

References Cited

UNITED STATES PATENTS

| | | | |
|---|---|---|---|
| 3,138,665 | 6/1964 | Chasek | 332—16 X |
| 3,212,027 | 10/1965 | Ko | 332—16 |

OTHER REFERENCES

Gentile: Basic Theory and Application of Tunnel Diodes, pub. van Nostrand and Co., 1962, pp. 204–207.

ALFRED L. BRODY, *Primary Examiner.*

U.S. Cl. X.R.

325—30, 38; 328—13; 329—1; 331—107; 332—2, 14, 52